United States Patent [19]

Bossert

[11] 4,216,429

[45] Aug. 5, 1980

[54] METHOD AND APPARATUS FOR QUANTITATIVELY MEASURING THE RECEPTION QUALITY OF A RECEIVED FREQUENCY-MODULATED ULTRASHORT-WAVE SIGNAL

[75] Inventor: Theodor T. Bossert, Munich, Fed. Rep. of Germany

[73] Assignee: Richard Hirschmann, Radiotechnisches Werk, Esslingen am Neckar, Fed. Rep. of Germany

[21] Appl. No.: 28,809

[22] Filed: Apr. 10, 1979

[51] Int. Cl.² .................. H04B 1/36; H04B 17/00
[52] U.S. Cl. .................. 455/148; 324/77 B; 455/246
[58] Field of Search ............... 325/363, 67, 332, 333; 343/17.7; 364/485, 551, 582; 324/57 N, 77 B, 77 D

[56] References Cited

U.S. PATENT DOCUMENTS

| 2,738,417 | 3/1956 | Hunt et al. | 325/67 |
| 3,107,330 | 10/1963 | Hausen | 325/67 |
| 3,283,257 | 11/1966 | Boyce | 325/363 |
| 3,495,176 | 2/1970 | Egan | 325/67 |

Primary Examiner—Marc E. Bookbinder
Attorney, Agent, or Firm—Michael J. Striker

[57] ABSTRACT

A frequency-modulated ultrashort-wave signal is received, but due to wave-reflection phenomena from physical bodies reflecting towards the receiving antenna is amplitude modulated, this amplitude modulation being dependent upon frequency. An amplitude-indicating signal and a frequency-deviation signal are derived from the received frequency-modulated signal and, instead of merely being applied to the x- and y-deflection inputs of an oscilloscope for partly subjective analysis by a skilled analyst, are applied, preferably via low-pass filters, to first and second differentiators, the two output signals of which are transmitted to a divider which produces a differential-quotient signal indicating the rate of change of the amplitude of the frequency-modulated signal with respect to the frequency deviation of the frequency-modulated signal. The differential-quotient signal is applied to an extreme-value-responsive indicator, whose read-out constitutes a direct quantitative measure of reception quality which can be used, for example, to automatically steer the receiving antenna.

13 Claims, 4 Drawing Figures

METHOD AND APPARATUS FOR QUANTITATIVELY MEASURING THE RECEPTION QUALITY OF A RECEIVED FREQUENCY-MODULATED ULTRASHORT-WAVE SIGNAL

BACKGROUND OF THE INVENTION

The present invention relates to methods and apparatus for quantitatively measuring or characterizing the reception quality of a received frequency-modulated ultra-shortwave signal.

Because broadcast frequency-modulated ultrashort-wave signals spread out in space as they are propagated, such a signal when received by a particular receiving antenna will comprise not only a directly transmitted component but also, superimposed thereon, signal components transmitted to the receiving antenna indirectly as a result of reflection of the broadcast waves off of reflecting structures, such as buildings, geological structures and the like. Those signal components attributable to such reflection of the broadcast waves can be considered as constituting a noise signal which modulates the received IF carrier with respect to both amplitude and phase, in a sense of course detracting from reception quality.

Quantitative measurement or characterization of the quality of reception in such circumstances is extremely important in many instances, for example where that information is to be relied upon for steering or adjusting the receiving antenna. Methods and systems serving this purpose are known; attention is directed, by way of example, to the British Broadcasting Corporation research report BBC RD 1975/33. With such conventional techniques, the amplitude modulation of the frequency-modulated carrier resulting from broadcast-wave reflections is ascertained as a function of frequency or frequency deviation of the carrier, and the quantitative reception quality characterization is derived from that relationship, in a manner discussed more fully below.

As already stated wave-reflection phenomena can be considered to act as a noise signal serving to modulate the frequency-modulated carrier with respect to both amplitude and phase. In general, it is not possible, i.e., during the actual reception of an ordinary ultrashort-wave FM broadcast, to continually ascertain with any meaningful precision to degree to which the carrier has become phase-modulated by the wave-reflection noise signal, because it is not possible to separately ascertain what phase variations, or components thereof, of the carrier signal are to be associated with the actual message signal, on the one hand, and the wave-reflection noise signal, on the other hand.

In contrast, it is possible to quantitatively ascertain the degree to which the frequency-modulated carrier has become amplitude-modulated by wave-reflection noise, for the simple reason that ultrashort-wave FM broadcasters of course take pains to assure that their transmitted carriers are of constant amplitude. Accordingly, at the receiver end, any amplitude fluctuations exhibited by the carrier can only be the result of noise.

In the already mentioned British Broadcasting Corporation research report BBC RD 1975/33 ("A field strength measuring receiver for band II"), a signal whose instantaneous value indicates the instantaneous amplitude of the frequency-modulated carrier is applied to the vertical-deflection input of an oscilloscope screen, and a signal whose instantaneous value indicates the instantaneous frequency or instantaneous frequency deviation is applied to the horizontal-deflection input. The resulting waveform generated on the oscilloscope screen displays the functional dependence of the frequency-modulated carrier's amplitude upon the frequency of the frequency-modulated carrier. The oscilloscope screen itself is provided with a horizontal axis directly calibrated in units of frequency. The oscilloscope screen is furthermore provided with a vertical axis directly calibrated in units of percentage amplitude modulation relative to the amplitude of the IF carrier if no wave-reflection noise phenomena were involved. E.g., when the ordinate value of the displayed graph is coincident with the horizontal axis of the display screen, this means that, here, the amplitude of the carrier equals 100% of the amplitude which the carrier would have if all wave-reflection modulating noise signals could somehow be removed. Where the ordinate value of the displayed curve is located above the horizontal axis, this means that the wave-reflection noise signals are increasing the amplitude of the IF carrier relative to such value; likewise, where the ordinate value of the displayed curve is located below the horizontal axis, this means that the wave-reflection noise signals are decreasing the amplitude of the IF carrier relative to the imaginary reflection-free situation.

Using the conventional procedure, the analyst notes the maximum ordinate value of the displayed curve and also the periodicity of the curve. After the periodicity of the curve has been perceived and its period decided upon, the analyst forms the reciprocal of the period, this constituting information concerning the delay in the reception of the reflected waves. Then, the analyst refers to a tabulation, e.g., a nomograph, which has been set up in advance to provide quantitative reception-quality values as a function of measured carrier amplitude-modulation values and reflected-wave delay times. This analytical procedure is not only laborious and time-consuming but also, to a very great extent, subjective in nature, in the sense that it very much depends upon the experience, skill and imagination of the analyst. Thus, for example, if one or more reflecting bodies are located rather close to the receiving antenna, and/or if many reflected-wave phenomena are concurrently contributing to the amplitude-versus-frequency curve generated on the display screen, the displayed information may not actually contain the requisite periodicity information and/or may be just too complicated for the periodicity information to be perceived by the analyst.

SUMMARY OF THE INVENTION

It is a main object of the invention to provide a novel method and apparatus for deriving, from the x-deflection and y-deflection signals used to drive such an oscilloscope display, quantitative reception-quality values in a manner which is simpler, more exact and more meaningful and reliable than in the prior-art techniques, and indeed in a manner so entirely objective and quantitative as to even make it unnecessary to resort to oscilloscope display, except, for example, for back-up purposes.

In accordance with the present invention, the desired quantitative reception-quality characterization is derived by ascertaining the extreme values of the rate of change (with respect to frequency deviation) of the IF carrier amplitude A normalized with respect to the amplitude value $A_o$ which the IF carrier would exhibit if somehow the noise attributable to wave-reflection phenomena could be eliminated from the reception situation, i.e., by ascertaining the extreme values of the differential quotient $$\partial A/A_o \partial \omega$$

such extreme values serving as a direct quantitative measure of the degree to which the signal is being contaminated by noise resulting from wave-reflection phenomena, and accordingly a direct measure of the reception quality.

Indeed, when the inventive differential-quotient technique is used, the extreme values of the differential quotient set forth above can be determined even without the use of the conventional oscilloscope display screen, e.g., directly on a digital read-out device.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1A:
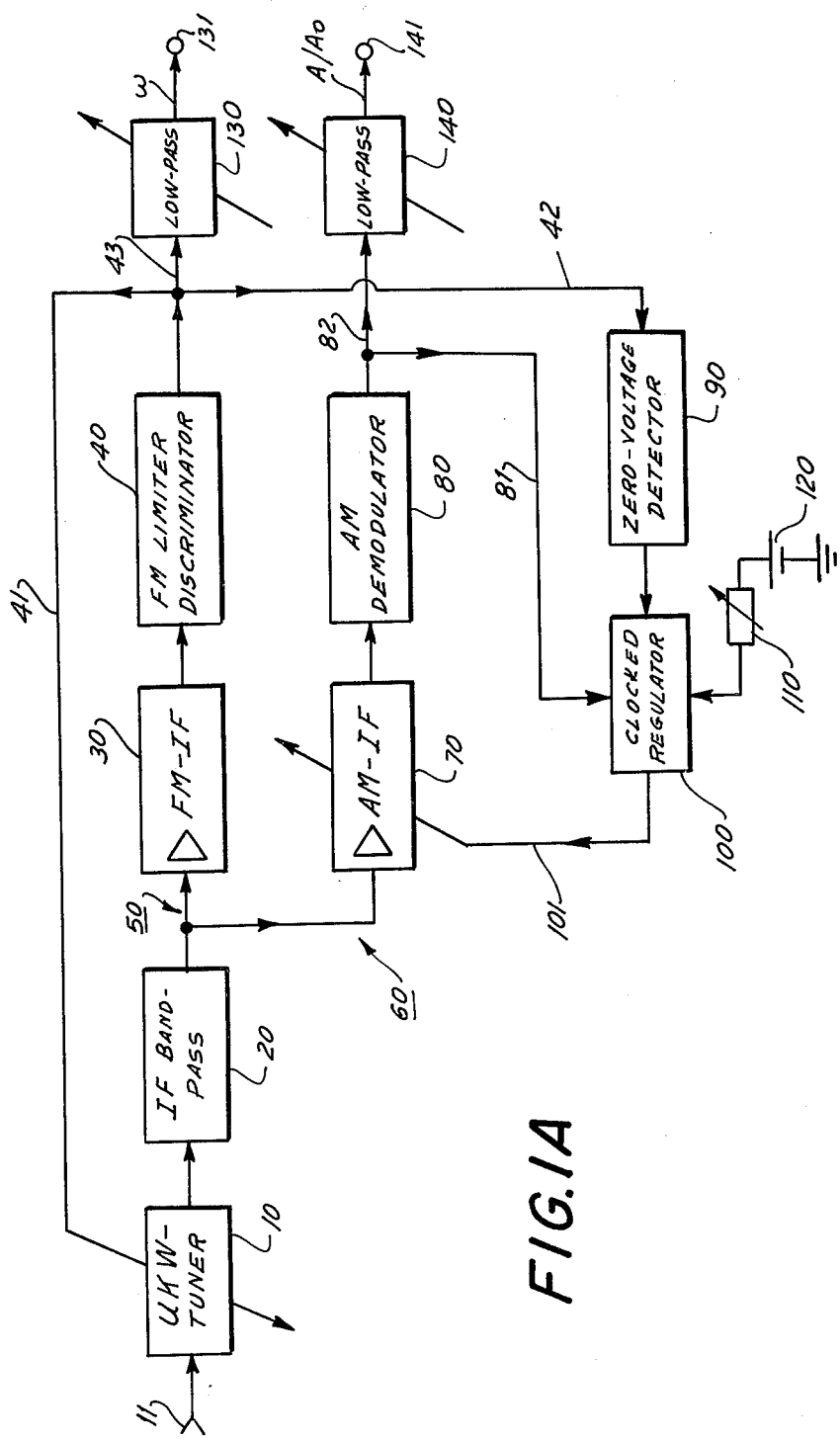
FIGS. 1A and 1B are the left and right halves of an exemplary circuit embodying the concepts of the present invention, with FIG. 1C graphically depicting the relationship between FIGS. 1A and 1B.
Figure 1B:
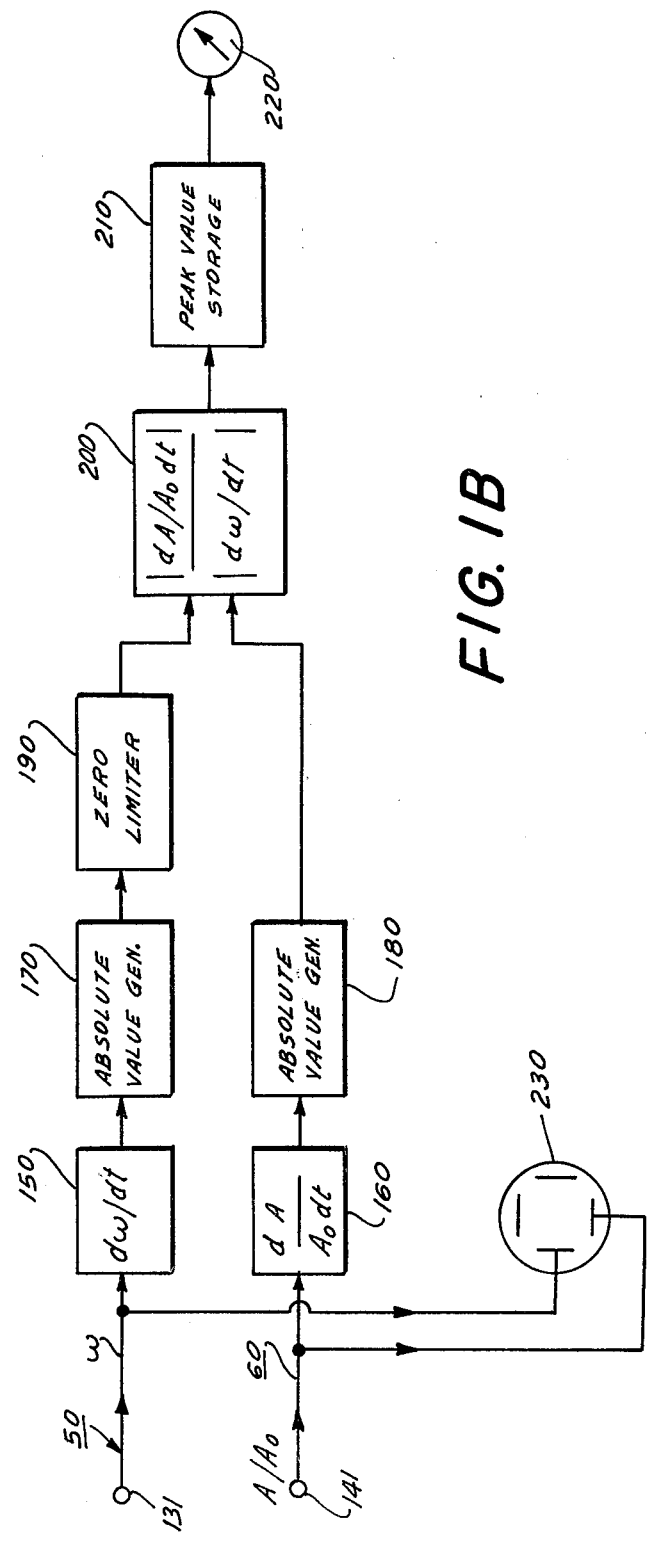
Figure 1C:
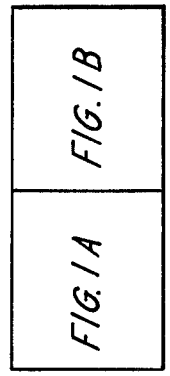

FIGS. 1A and 1B, as symbolically indicated in FIG. 1C, are the left and right halves of a single circuit diagram. The circuitry shown in FIG. 1A mainly comprises a conventional ultrashort-wave FM receiver, supplemented in accordance with the present invention for generating quantitative reception-quality information.

In FIG. 1A, numeral 10 denotes an ultrashort-wave FM tuner supplied with an ultrashort-wave FM signal by a receiving antenna 11. In per se conventional manner, the output signal of tuner 10 is transmitted through an IF bandpass filter 20, the latter serving to pass on only the IF carrier signal recovered in tuner 10. The output of IF bandpass filter 20 branches out into two signal branches 50, 60. Signal branch 50, comprising the other components of a conventional FM receiver, includes an FM intermediate-frequency amplifier 30, followed by a limiter-discriminator 40. The output signal from limiter-discriminator 40 is the recovered message signal and can, if desired, be applied to a transducer system for audible reproduction, although that is not shown in the drawing, the illustrated circuitry relating only to quantitative reception-quality measurement.

As already stated, the still frequency-modulated IF carrier is also applied to a signal branch 60, which comprises a controllable-gain AM intermediate-frequency amplifier 70, followed by an amplitude demodulator 80. The signal produced at the output of amplitude demodulator 80 indicates the amplitude of the frequency-modulated IF carrier. The gain-control input of controllable-gain amplifier 70 is connected to the output of a clocked negative-feedback regulator 100 via a control line 101. The actual-amplitude signal input of clocked amplitude regulator 100 is connected, via a feedback line 81, to the output of amplitude demodulator 80, for receipt of the signal indicating the actual amplitude of the IF carrier. The desired-amplitude signal input of regulator 100 receives a desired-amplitude signal via a potentiometer 110 from a D.C. voltage source 120. The clocked amplitude regulator 100 is clocked by a zero-voltage detector 90, e.g., a window discriminator, whose input is connected via a line 42 to the output of the limiter-discriminator 40. When the output signal of discriminator 40 equals zero, zero-voltage detector 90 clocks clocked amplitude regulator 100, the latter registers the actual-amplitude signal on line 81, produces on line 101 a corrective gain-control signal, and the latter signal is held and persistently applied to the gain-control input of amplifier 70 until the next time amplitude regulator 100 is clocked.

The output signal of discriminator 40 is additionally fed back to the negative-feedback control input of ultrashort-wave tuner 10 via a line 41, for conventional negative-feedback regulation during frequency demodulation. The respective output signals from discriminator 40 and from amplitude demodulator 80 are transmitted, via respective lines 43 and 82 and variable-bandwidth low-pass filters 130 and 140. The signal produced at the output 131 of filter 130 corresponds to the instantaneous frequency deviation $\omega$ of the frequency-modulated IF carrier, as will be understood by persons skilled in the art. The signal produced at the output 141 of low-pass filter 140 corresponds to the ratio $A/A_o$, wherein A is, very simply, the instantaneous amplitude of the frequency-modulated IF carrier, and wherein $A_o$ is the constant amplitude which the frequency-modulated IF carrier would have if, somehow, the sources of wave-reflection noise, i.e., the responsible reflecting bodies, could be removed from the reception situation. Accordingly, the output signal $A/A_o$ at terminal 141 corresponds to the instantaneous amplitude of the frequency-modulated IF carrier, but normalized with respect to the hypothetical reflection-free amplitude value of the carrier.

As shown in FIG. 1B, the frequency or frequency-deviation signal $\omega$ is applied to the horizontal-deflection input of an oscilloscope 230, whereas the normalized amplitude signal $A/A_o$ is applied to the vertical-deflection input thereof.

The circuit depicted in FIG. 1A operates as follows:

Components 10, 20, 30, 40 merely correspond to a conventional untrashort-wave FM receiver, and therefore their operation should not require detailed explanation, except to note once more that the output signal of limiter-discriminator 40 is here being used to derive a signal $\omega$ indicating the instantaneous value of the frequency deviation of the frequency-modulated IF carrier, i.e., per se, as opposed to mere message-signal recovery, although of course the output signal from discriminator 40 can also, if desired, be used for audible message-signal reproduction.

In signal branch 60, the still frequency-modulated IF carrier is amplified by AM intermediate-frequency amplifier 70 with a gain automatically established by negative-feedback amplitude regulator 100. However, the negative-feedback regulation of the IF carrier amplitude is performed is such as way that, to the extent possible, the negative-feedback regulation is responsive only to the reflection-free $A_o$ component of the carrier amplitude and, to the extent possible, not at all responsive to the component(s) of the carrier amplitude attributable to wave-reflection phenomena. As a result, the reflection-free component $A_o$ of IF carrier is, i.e., in circuit branch 60, maintained constant, e.g., irrespective of what physical amplitude fluctuations might be occurring during ongoing receiving-antenna rotation, for example. Accordingly, the actual instantaneous IF carrier amplitude A is at all times kept normalized with respect to such constant reflection-free amplitude component $A_o$. This special-purpose amplitude regulation is made possible, in the illustrated embodiment, by the zero-voltage detector 90 which ascertains when the instantaneous value of the frequency deviation $\omega$ of the frequency-modulated IF carrier, as detected at the output of limiter-discriminator 40, goes to zero. When the frequency deviation $\omega=0$, this means, or here is presumed to mean, that at this moment the amplitude of the still frequency-modulated IF carrier at the output of IF bandpass filter 20 corresponds to the reflection-free amplitude value $A_o$ discussed above. In dependence upon this detection performed by detector 90, clocked amplitude regulator 100 is clocked and, in dependence upon the amplitude-indicating signal on line 81 and the desired-amplitude signal from potentiometer 110, produces on line 101 a gain-control signal for amplifier 70, and this gain-control signal is held and persists on line 101 until the next time that clocked regulator 100 is thusly clocked. In particular, regulator 100 becomes unresponsive to the actual-amplitude signal on line 81 as soon as zero-voltage detector 90 detects, at the output of limiter-discriminator 40, a non-zero voltage.

Figure 2:
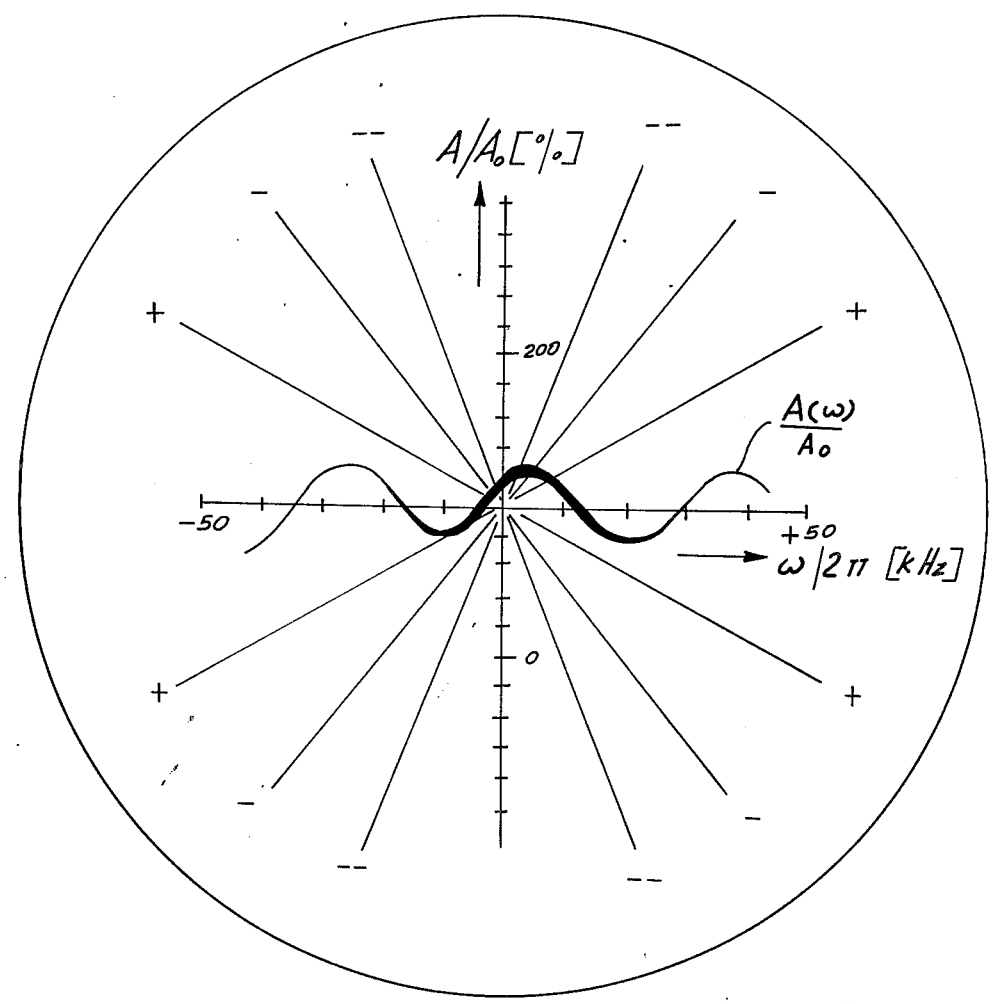
FIG. 2 depicts an amplitude-versus-frequency curve, normalized in accordance with the concepts of the present invention, on the display screen of an oscilloscope.

In FIG. 1B, as already stated, the two signals $\omega$ and $A/A_o$ are shown respectively applied to the horizontal- and vertical-deflection inputs of an oscilloscope 230. FIG. 2 depicts the appearance of the displayed normalized-amplitude versus frequency-deviation curve. The horizontal reference axis, calibrated in units of frequency, on the oscilloscope screen and the vertical reference axis implied by the displayed amplitude-versus-frequency curve are brought into register by adjustment of potentiometer 110 in FIG. 1A, and thereafter stay in register, even for example if the receiving antenna is thereafter rotated, making it simple to perform the measurements needed for generation of a quantitative reception-quality characterization. Measuring accuracy is, in the illustrated embodiment, further improved by the provision of the two variable-bandwidth low-pass filters 130, 140 at the x-and y-deflection inputs of the oscilloscope, and by correctly selecting the bandwidths of the variable-bandwidth filters 130, 140 the curve's lack of ambiguity is preserved.

In FIG. 2, the horizontal reference axis provided on the screen is, as already stated, calibrated in units of frequency, whereas the vertical scale is calibrated in units of percentage amplitude modulation, i.e., of the frequency-modulated IF carrier relative to the amplitude value $A_o$ which the carrier would have in the absence of wave-reflection phenomena. Thus, for example, where a point on the displayed normalized-amplitude versus frequency-deviation curve intersects the horizontal reference axis, such point has an ordinate value of 100%, indicating that, at this frequency, the actual amplitude of the frequency-modulated IF carrier equals the presumed reflection-free amplitude value $A_o$. For the sake of explanation, the amplitude-versus-frequency curve illustrated is sinusoidal. However, persons skilled in the art will understand that, in general, the reflected-wave phenomena encountered will result in a displayed curve of substantially greater complexity.

The present invention provides a novel, and very objective and definite technique for driving a reception-quality characterization; This novel technique can be implemented, by way of examle, using the circuitry depicted in FIG. 1B.

In FIG. 1B, the instantaneous frequency-deviation signal $\omega$ is applied to the input of a differentiator 150, at whose output is produced a signal corresponding to the derivative of frequency deviation with respect to time, $d\omega/dt$. Likewise, the normalized-amplitude signal $A/A_o$ is applied to a differentiator 160, at whose output is produced a signal corresponding to the time derivative of the normalized IF carrier amplitude, $dA/A_o dt$. The signal $d\omega/dt$ is transmitted through an absolute-value generator 170 which produces a signal whose magnitude corresponds to that of $d\omega/dt$ but is independent of the sign of the latter expression; the absolute-value generator can, merely by way of example, comprise an operational amplifier porvided with a bridge rectifier. The output signal from absolute-value generator 170 is transmitted through a zero limiter 190 and then applied to the first input of a divider 200. The signal $dA/A_o dt$ is transmitted through a second absolute-value generator 180 to the second input divider 200, without the intermediate of a zero limiter. The signal produced at the output of divider 200 corresponds to the quotient $$\frac{\left|\frac{dA}{A_o dt}\right|}{\left|\frac{d\omega}{dt}\right|} = \left|\frac{\partial A}{A_o \partial \omega}\right|$$

The zero limiter 190 serves to prevent the denominator of the expression on the left, i.e., $|d\omega/dt|$ from going to zero and making the differential quotient go to infinity.

Accordingly, the output signal from divider 200 indicates the magnitude of the slope or gradient of the displayed normalized-amplitude versus frequency-diviation curve.

In accordance with the present invention, the extreme values of this differential quotient are utilized as a direct measure of the quality of the noise-modulated ultrashort-wave FM signal being received by antenna 11 (FIG. 1A). To this end, the output signal from divider 200 is applied to an extreme-value storage 210 which may, for example, comprise an emitter follower with a storage capacitor or be of another conventional type. The output signal of the extreme-value storage 210 is applied to a digital or analog indicator 220, e.g., a digital or analog voltmeter.

Indeed, when the circuitry shown in FIG. 1B is employed to automatically generate the quantitative reception-quality characterization, display of the amplitude-versus-frequency curve on the oscilloscope screen of FIG. 2 actually becomes in a sense of superfluous, although certainly helpful for back-up purposes.

If the frequency-deviation signal $\omega$ and the normalized IF-carrier amplitude-indicating signal $A/A_o$ are fed to the oscilloscope for curve display as shown in FIG. 2, then for off-the-screen read-off of the slope of the displayed curve, which slope corresponds to the differential quotient of interest, the screen can be provided, as shown in FIG. 2, with a family of straight lines all intersecting the origin and having different respective slopes. This makes possible a quick visual evaluation, albeit a somewhat coarse one, of reception quality. In FIG. 2, six such straight lines, having three different slopes, are provided, the one with the lowest slope being designated "+," the one with intermediate slope being designated "—," and the one with the greatest slop being designated "— —." The ranges of curve slope associated with these slope limits correspond to the following ranges of reception quality:

+ reception of music still good;
— reception of music bad, but of speech still good;
— — reception of speech bad.

It will be understood that each of the elements described above, or two or more together, may also find a useful application in other types of circuits and display techniques differing from the types described above.

While the invention has been illustrated and described as involving a particular method of quantitatively characterizing the quality of an ultrashort-wave FM reception, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of quantitatively measuring the reception quality of a frequency-modulated ultrashort-wave signal where the frequency signal exhibits amplitude modulation resulting from wave-reflection phenomena, comprising: measuring the instantaneous frequency deviation of the frequency modulated ultrashort-wave signal; measuring the amplitude of the frequency modulated ultrashort-wave signal; deriving from said measured amplitude and frequency deviation a differential-quotient measurement $$\partial A/A_o \partial \omega,$$

wherein A corresponds to the amplitude of the frequency-modulated signal, wherein $A_o$ corresponds to the amplitude value which the frequency-modulated signal would have if the wave-reflection phenomena were removed from the reception situation, and wherein $\omega$ is the instantaneous frequency deviation of the frequency-modulated signal; and ascertaining the extreme values of said differential quotient, these values constituting a quantitative characterization of the quality of reception of the frequency-modulated signal.

2. The method defined in claim 1 further comprising: deriving from the frequency-modulated ultrashort-wave signal an amplitude-indicating signal indicating the amplitude A of the frequency-modulated signal, and maintaining the amplitude-indicating signal normalized with respect to the reflection-free amplitude value $A_o$ which the received frequency-modulated signal would exhibit in the absence of the wave-reflection phenomena by generating a frequency-deviation signal indicating the instantaneous frequency deviation $\omega$ of the received frequency-modulated signal, generating a frequency-deviation-zero signal when the frequency-deviation signal indicates substantially zero frequency deviation and regulating the level of the amplitude indicating signal with a negative feedback amplitude regulator in response to changes in said level under control of said frequency-deviation-zero signal.

3. The method defined in claim 2, further comprising passing the received frequency-modulated ultrashort-wave signal through a tuner and then through an IF bandpass filter to produce a frequency-modulated IF signal, the deriving of the amplitude-indicating signal comprising passing the frequency-modulated IF signal though an AM IF amplifier and then through an amplitude demodulator, the generating of the frequency-deviation signal comprising passing the frequency-modulated IF signal through an FM IF amplifier and then through a limiter-discriminator, said step of regulating including the steps of generating a clocking signal in response to the limiter-discriminator output indicating that the frequency deviation of the frequency modulated IF signal is zero and controlling the gain of the AM IF amplifier with a clocked amplitude regulator in response to said clocking signal and an output of said amplitude demodulator.

4. The method defined in claim 1, said differential-quotient being derived in the form of an electrical signal, furthermore comprising the step of applying the differential-quotient signal to an extreme-value store which indicates the extreme value of the differential-quotient signal.

5. An apparatus for use in quantitatively measuring the reception quality of a frequency-modulated ultrashort-wave signal where the frequency-modulated signal exhibits amplitude modulation resulting from wave-reflection phenomena, the apparatus comprising, in combination, means deriving from the frequency-modulated signal an amplitude-indicating signal indicating the amplitude of the frequency-modulated signal; means deriving from the frequency-modulated signal a frequency-deviation signal indicating the instantaneous frequency deviation of the frequency-modulated signal; first differentiator means receiving the amplitude-indicating signal and deriving therefrom an amplitude time-derivative signal; second differentiator means receiving the frequency-deviation signal and deriving therefrom a frequency-deviation time-derivative signal; divider means generating a differential-quotient signal corresponding to the ratio of the respective time-derivative signals; extreme-value storage means operative for providing the extreme value of the differential-quotient signal and means for providing a quantitative indication of the extreme value.

6. The apparatus defined in claim 5 wherein the first and second differentiator means each comprises a respective absolute-value generator operative for furnishing the respective time-derivative signals in absolute-value form.

7. The apparatus defined in claim 6 wherein the second differentiator means further comprises a zero limiter operative for preventing the frequency deviation time-derivative signal from assuming values closer to zero than a predetermined value.

8. The apparatus defined in claim 5, the means deriving the amplitude-indicating signal and the frequency-deviation signal comprising a shared ultrashort-wave FM tuner receiving the ultrashort-wave signal from an antenna and an IF bandpss filter producing a frequency-modulated IF signal, the means deriving the frequency-deviation signal comprising a first circuit branch receiving the IF signal and including an FM IF amplifier and a limiter-discriminator wherein the means deriving the amplitude-indicating signal comprising a second circuit branch receiving the IF signal and including an AM IF amplifier and an amplitude demodulator.

9. The apparatus defined in claim 8, furthermore including first and second low-pass filters respectively operative for applying the amplitude-indicating signal and the frequency-deviation signal to the first and second differentiator means.

10. The apparatus defined in claim 6, wherein the absolute-value generators comprise operational amplifiers and bridge rectifiers.

11. The apparatus defined in claim 5 wherein the extreme-value storage means comprises a peak-value store including an emitter-follower stage to whose output is connected a storage capacitor.

12. The apparatus defined in claim 5 wherein the means providing a quantitative indication of the extreme value is a voltage-measuring instrument.

13. The apparatus defined in claim 5, furthermore including a display device having x- and y-deflection inputs, and respective variable-bandwidth low-pass filters applying to the deflection inputs respective ones of the frequency-deviation signal and the amplitude indicating signal.

* * * * *